United States Patent
Carl et al.

(10) Patent No.: US 6,275,804 B1
(45) Date of Patent: Aug. 14, 2001

(54) PROCESS AND CIRCUIT ARRANGEMENT FOR STORING DICTATIONS IN A DIGITAL DICTATING MACHINE

(75) Inventors: Holger Carl; Dirk Kirchmann, both of Fuerth (DE)

(73) Assignee: Grundig AG, Fuerth (DE)

( * ) Notice: Subject to any disclaimer, the term of this patent is extended or adjusted under 35 U.S.C. 154(b) by 0 days.

(21) Appl. No.: 09/051,729

(22) PCT Filed: Aug. 19, 1997

(86) PCT No.: PCT/EP97/04511

§ 371 Date: Jul. 21, 1998

§ 102(e) Date: Jul. 21, 1998

(87) PCT Pub. No.: WO98/08223

PCT Pub. Date: Feb. 26, 1998

(30) Foreign Application Priority Data

Aug. 21, 1996 (DE) .............................. 196 33 648

(51) Int. Cl.$^7$ .................................. G10L 11/00
(52) U.S. Cl. ............................. 704/270; 704/201
(58) Field of Search .................. 704/270, 200, 704/201, 229, 500, 501, 503; 700/500, 503

(56) References Cited

U.S. PATENT DOCUMENTS

| 4,468,751 | * | 8/1984 | Plunkett ................................ 364/900 |
| 5,008,871 | * | 4/1991 | Howells et al. ........................ 369/28 |

(List continued on next page.)

FOREIGN PATENT DOCUMENTS

| 3244629 | 6/1983 | (DE) | ................................. G11C/7/00 |
| 4214053 | 9/1993 | (DE) | .............................. G11B/27/029 |
| 2253078 | 8/1992 | (GB) | ................................. G06F/3/16 |
| 06236313 | 8/1994 | (JP) | ................................. G06F/12/00 |

OTHER PUBLICATIONS

Patent Abstracts of Japan, vol. 018, No. 621 (P–1832) Nov. 25, 1994 & JP 06 236313 A (TEAC Corp., Aug. 23, 1994).

Biethan, Gunter: Systemprogrammierung unter MS–DOS/PC–DOS, Vogel–Buchverlag, Würzburg (1988), pp. 275–294.

*Primary Examiner*—Richemond Dorvil
(74) *Attorney, Agent, or Firm*—Paul Vincent

(57) ABSTRACT

The digital storage of speech signals in a semiconducting memory is known in the art. Large quantities of storage space are required for storing speech signals and therefore, for long recordings for example dictations, a very large semiconductor memory is needed. This is advantageously implemented using a so-called flash memory. However, the contents of such a memory can only be erased in large sections at a time so that minor changes such as partial erasures and insertions are not possible. The total available memory is subdivided into clusters and a table of contents is created in which the stored files and the state occupation of each cluster is stored, at is known in the art concerning the DOS file manager. Moreover, information which indicates which cluster is the next cluster of a file is stored for each cluster in a file allocation table. This process in accordance with the invention allows for erasures or insertions to be carried out by altering the indication in the file allocation table to the following cluster. In this manner, clusters may be both inserted into and removed from a file. In addition, information on each cluster includes the number of speech frames stored in the cluster and from which address the first speech frame is stored. It is thereby possible to logically remove individual speech frames, forming the smallest subdivision of the stored speech signal, from the file at the beginning or end of a cluster without having to execute an erasing process.

12 Claims, 2 Drawing Sheets

U.S. PATENT DOCUMENTS

| | | | |
|---|---|---|---|
| 5,283,885 | * 2/1994 | Hollerbauer | 395/425 |
| 5,337,275 | 8/1994 | Garner | 365/189 |
| 5,761,529 | * 6/1998 | Raji et al. | 395/824 |
| 5,812,882 | * 9/1998 | Raji et al. | 395/892 |
| 5,835,588 | * 11/1998 | Zell | 380/4 |
| 5,960,447 | * 9/1999 | Holt et al. | 707/500 |
| 5,978,755 | * 11/1999 | Podhradsky | 704/201 |

* cited by examiner

PROCESS AND CIRCUIT ARRANGEMENT FOR STORING DICTATIONS IN A DIGITAL DICTATING MACHINE

BACKGROUND OF THE INVENTION

The invention concerns a method for the storage of speech data in files in a digital dictation device with which the memory for the speech data is subdivided into clusters and each cluster is associated with a reference in a file allocation table to the next cluster of the file with the last cluster of the file being associated with a data end signal.

The grouping of stored data into differing units is known in the art of personal computers, in particular with the DOS operating system. The smallest information unit is a bit, with eight bits being grouped together into a byte and a particular number of bites (e.g. 512) forming a cluster. In this manner, data can be accessed not only bit by bit rather also in clusters. In particular for bulk storage media, this shortens the time required for changing the content of the memory (e.g. copying or deleting).

A contents register is also stored on the bulk storage medium in order to correlate a file to the physical storage location of the bulk storage medium. The contents register stores, for each file, the address of the cluster of the bulk storage medium first used for storage. In addition, a file allow cation table (abbreviated FAT) is stored on the bulk storage medium which contains the address of the subsequent cluster used to store the file in the address of the currently utilized cluster. The file allocation table FAT has a file-end entry in the last cluster used for storage, since no subsequent cluster exists.

Access to the memory region in which a file is stored is effected by searching the file name in the contents register of the bulk storage medium and the address of the first cluster stored in connection with the file name is utilized for access both to the file allocation table FAT as well as to the data in the file. Access to the FAT provides the address of the next cluster and the next entry in the file allocation table FAT. When the end of the file is reached, this entry contains a file-end mark. In this manner one recognizes that no further clusters belong to the file.

Files must also be stored in digital dictating machines containing speech recordings and their structure and management should be effected as in personal computers in accordance with the conventional DOS file formats in order to facilitate exchangeability of the storage medium between a portable dictating machine and a personal computer, however, with the modifications necessary for speech recording.

In speech recording using digital dictating machines one has, up to this point in time, been able to record the normally compress ed speech data without any problems including, at most, recording interruptions but otherwise always attaching new data to the current end of the file. This situation changes if so-called edit functions are to be facilitated. Such is the case with e.g. insertion of recordings at arbitrary locations into the existing recording as well as the deletion of arbitrary defined sections of an existing recording. These functions should of course be carried out in such a fashion that a subsequent play-back of the entire recording is effected with the individual sections being in the proper (logical) sequence and without interruptions.

In word processing systems this can be done by displacing the data of the existing record in correspondence with the insertion or deletion. Word processing systems can proceed in this manner, since text documents are usually completely loaded into the working memory of the personal computer where data manipulations can be rapidly facilitated. Since, however, speech data, in comparison to text data, require substantially more memory this process is very time-consuming and therefore user-unfriendly even in the event of a fast memory, particularly, however, with a slow bulk storage medium.

When storing speech data in a flash memory of a portable dictating machine, displacement of data is also extremely inefficient, since a flash memory must be erased prior to recording and the deletion, which can normally also only be simultaneously carried out for large memory regions, requires a relatively long amount of time and large amount of power.

It is therefore the purpose of the present invention to present a method which avoids the above mentioned disadvantages and which facilitates editing of data stored in accordance with the DOS standard in as rapid a manner and power-saving fashion as possible even if the files are stored on a relatively slow bulk storage medium. This should be guaranteed in particular when utilizing flash memories as bulk storage media.

SUMMARY OF THE INVENTION

This purpose is achieved in accordance with a method for the storage of speech data in files in a digital dictation device with which the memory for the speech data is subdivided into clusters, each cluster being associated with a reference in a file allocation table to the next cluster of the file. The last cluster of a file is associated with a data end-signal. The clusters are subdivided into speech frames and, in each cluster, validity information is stored for the speech frames stored therein, with the validity information indicating the storage location of the first speech frame of a cluster and how many speech frames are stored in the cluster. The remaining memory of the cluster stores encoded speech frames with the speech frames being marked with speech frame headers.

The dependent claims describe advantageous improvements.

In accordance with the invention, editing functions are carried out through manipulation of the references to the subsequent cluster to be output or to the subsequent speech frame to be output. Reference to a cluster having (logically) deleted data only is replaced by a reference to the subsequent cluster not containing deleted data. In this fashion, the chain of clusters is broken-up and reassembled in a manner shortened by the (logically) deleted data. The freed clusters are thereby either directly marked as being free or—in the case of a flash memory—indicated as "dirty" (released for deletion =potentially free).

In addition, for insertions, the necessary number of clusters can be easily added to clusters using the list linked together via the file allocation table in that, at the location where the insertion should be effected, the reference to the originally subsequent cluster is replaced with a reference to the first cluster which is to be inserted. For the last cluster to be inserted, reference is made to the originally subsequent cluster.

With speech frames which are to be deleted within a cluster, an additional reference to the first speech frame of the cluster and/or in addition the number of speech frames stored in the cluster is stored to thereby newly define the number of speech frames to be output. These references are stored at the beginning of each cluster at storage locations provided and reserved therefor. During output, one checks, in each case, for the last, therefore valid, entry for the address of the first speech frame and for the number of speech frames.

In order to guarantee most effective dictating including editing functions (insertion, gap-free deletion, recording-over dictations in a flash memory) in a cluster-oriented operating system using minimal amount of hardware (small working memory and limited processor capability), the following measures are, in particular, undertaken:

The cluster-oriented data system is adapted to the requirements through direct manipulation of the FAT and/or of one or more clusters. Cluster headers are utilized having entries for start addresses of the first speech frame and of the number of speech frames per cluster each having a plurality of entries for correction possibilities which are particularly useful in flash memory systems and having an entry for the speech encoding algorithm utilized.

This type of cluster header facilitates optimal memory usage by configuration of the speech frames in a cluster-independent fashion. In addition, a high memory resolution is achieved compared to the amount of memory required by the header. This is particularly important for so-called silence frames in speech-encoding algorithms having speech pause compression requiring relatively little memory. Insertion of frame headers before each speech frame facilitates the encoding of differing frame lengths e.g. for memory-saving speech-encoding algorithms having speech pause recognition.

The features of the claims are described in the subsequent embodiments in an exemplary fashion using the drawings. The embodiments are not an exhaustive enumeration of possible configurations in accordance with the invention, rather are only exemplary in character. The features of the claims can be utilized individually or in arbitrary combination.

DESCRIPTION OF THE PREFERRED EMBODIMENT

Figure 1:
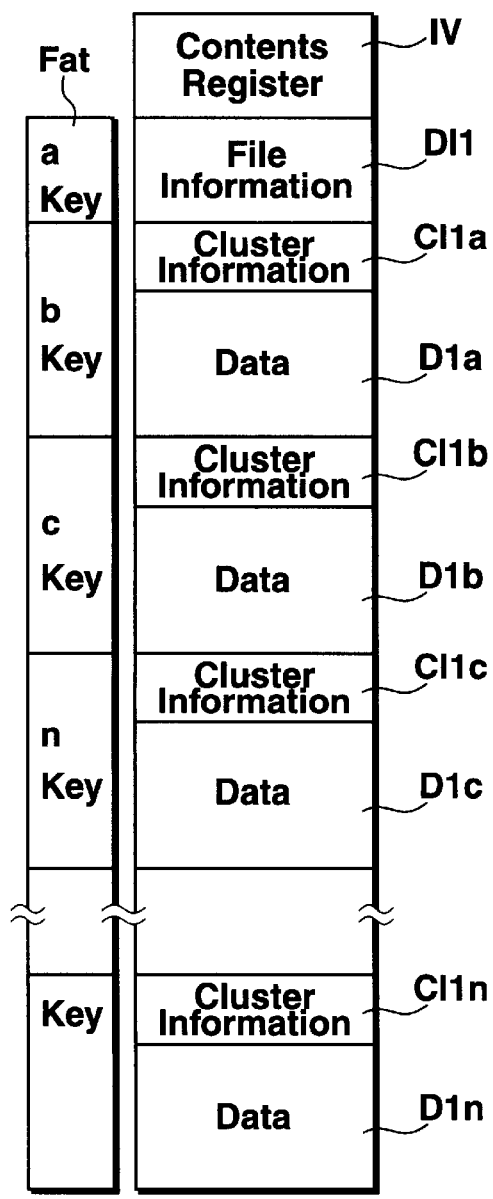
FIG. 1 shows the occupancy of a bulk storage medium with a file with references in a file allocation table to the next cluster.

FIG. 1 schematically shows a possible occupancy of a bulk storage medium, in particular, a storage disk or a similarly managed semi-conductor memory, having files beginning with file information DI1 whose data D1a, D1b, D1c . . . D1n is stored in clusters, wherein each cluster contains cluster information Cl1a, Cl1b, Cl1c . . . Cl1n next to the data D1a, D1b, D1c . . . D1n.

A contents register IV is initially stored in the bulk storage medium for correlating a first cluster of the bulk storage medium with a file identification key, in particular a file name, in a first principal entry as is known in the art from DOS.

In addition, the FAT stores information concerning the state of occupancy of each cluster of the bulk storage medium in order to be able to rapidly recognize the occupied and free clusters of the bulk storage medium as is also known in the art from DOS.

To start a first dictation, file information DI1, subsequently designated as the dictation header, is stored containing various information important for the play-back of the dictation. In particular, the dictation header contains information such as the number of file header clusters, file type identification, version number, software licence number, author, processing number, processing state, time of recording, recording end, length of dictation, write protection and additional information. The additional information contains memory addresses of separate speech inserts, so-called speech infos, which can be utilized individually by the user of the dictation machine for the filing and/or creation of additional information.

Information, which is important for play-back can also be stored in file information DI1.

Cluster information Cl1a for the first cluster follows. This contains the memory addresses of the first speech frame of the cluster, the number of speech frames stored in the cluster as well as an identification key for the compression algorithm used. Cluster information Cl1a can store this information a plurality of times in order to facilitate change or deletion processes. A chaining-together of speech frames having the most differing of lengths as well as a memory-saving and efficient subdivision of the individual clusters in speech frames without gaps and in a cluster-independent fashion is thereby facilitated. The ratio of the number of speech frame subdivisions of the cluster to the memory requirements of the cluster information is quite high. In contrast to prior art, in which a validity flag is set for each speech frame, in accordance with the invention, the start address of the first speech frame as well as the number of speech frames is stored. Only one address region is thereby utilized for a predetermined number of speech frames, independent of the maximum number of speech frames which could be stored in a cluster. A validity flag would otherwise have to be set for each individual speech frame of the maximum possible frames. This would lead to too high a storage requirement.

Segmentation of the speech signal during compression encodes speech frames having approximately 20 ms duration each for the speech signal. In this fashion a time precision is possible which corresponds to the duration of a speech frame. Memory requirements of the speech frame c an differ. In general, not all clusters will start with a new speech frame. It is therefore necessary to note the beginning of the first speech frame in each cluster using the memory address of the first speech frame.

Indication of the number of speech frames stored in a cluster and the storage address of the first speech frame permits logical deletion of speech frames at the beginning and at the end of a cluster so that their output can be suppressed without physically erasing the memory. If, for example, three speech frames are to be logically erased at the beginning of the cluster, the address of the fourth speech frame physically stored in the cluster is entered as the storage address of the first speech frame and the number of speech frames present in the cluster is reset from eight to five. In this fashion the first three speech frames stored are skipped during play-back.

If the last three speech frames are to be logically deleted, only the number of speech frames stored in the cluster is reset from five to two. In this fashion the last three speech frames are skipped. The speech frames which are no longer needed must therefore no longer be directly physically erased. It is sufficient if they are designated as nonoccupied. This is particularly when utilizing a flash memory, advantageous since this memory can generally only be erased in clusters or in multiples of clusters. Deletion of a single speech frame in one cluster is not possible.

As soon as a complete cluster no longer contains speech frames which are intended for play-back, the entry in the file allocation table FAT of the bulk storage medium is manipulated in such a fashion that the entire cluster is no longer played-back. A reference to a cluster having logically deleted data only is replaced by a reference to the next cluster of the same file having non-deleted data. In this fashion, the chain of clusters is separated and rejoined shortened by the (logically) deleted data. The freed clusters are thereby either directly marked as free or, in the event of a flash memory, as "dirty" (released for erasure=potentially free). In the event that the entry in the file allocation table FAT for the first cluster of a file contains a reference to a second cluster prior to the deletion process and if the entry in the file allocation table FAT for this cluster contains a reference to a third cluster, a deletion process with which the speech frames of the second cluster are completely erased changes the reference in the file allocation table FAT for the first cluster in such a fashion that it no longer refers to the second, rather to the third cluster. The second cluster is at least released for erasure by a corresponding marking. In this fashion, only the speech frames of the first and third clusters are output during play-back.

Figure 2:
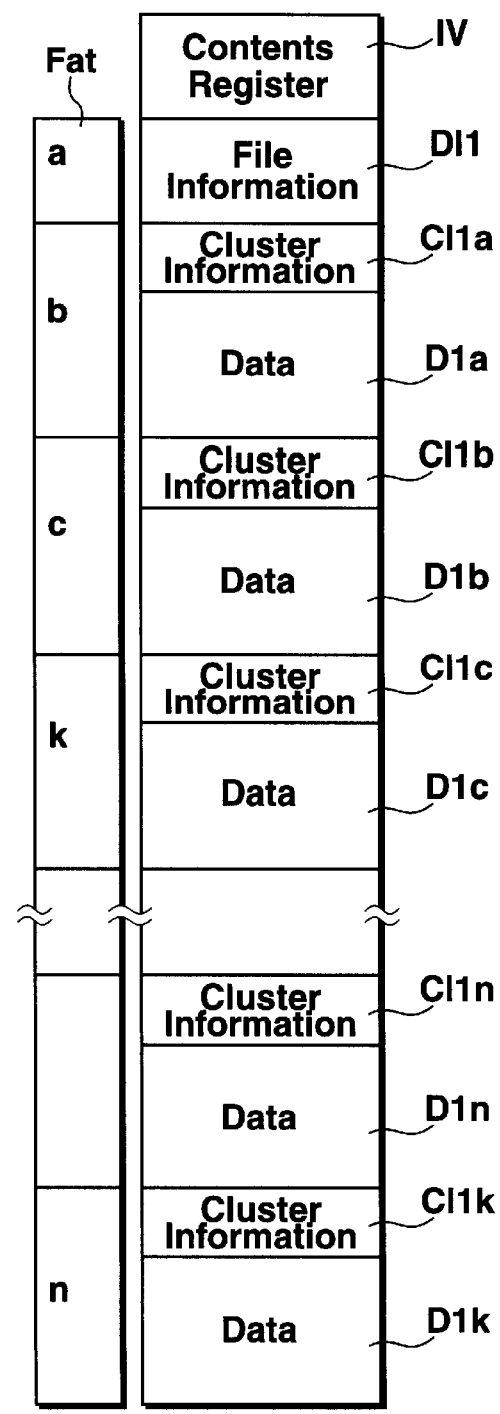
FIG. 2 shows the physical and logical configuration of the cluster of a file in the bulk storage medium following an insertion.

Conversely, during insertion, (FIG. 2) the necessary numbers of clusters can be easily recorded into the current sequence in that, at the position at which the insertion should occur, the entry in the file allocation table FAT referring to the initial subsequent cluster is replaced by a reference to the first cluster to be inserted and, for the last cluster to be inserted, a reference is made in the file allocation table FAT to the original subsequent cluster. The clusters to be inserted can thereby be physically disposed at an arbitrary location the bulk storage medium.

The method in accordance with the invention therefore facilitates particularly rapid changes. In this manner, clusters are both inserted into a file and removed from a file by changing the references to each subsequent cluster.

Cluster information Clx (FIG. 3a) additionally records the number of speech frames stored in the corresponding cluster and the address subsequent to which the first speech frame is stored. It is thereby possible to remove individual speech frames from the file at the beginning or end of a cluster, same forming the finest subdivision of the speech signal stored. In this fashion, portions of a file can be logically erased without having to physically execute a deletion process. In this manner, both power as well as processing time for a deletion procedure are saved.

The speech frame header contains e.g. information concerning the suppression of speech pauses which can be effected in various steps in dependence on the quality of the recording.

Figure 3:
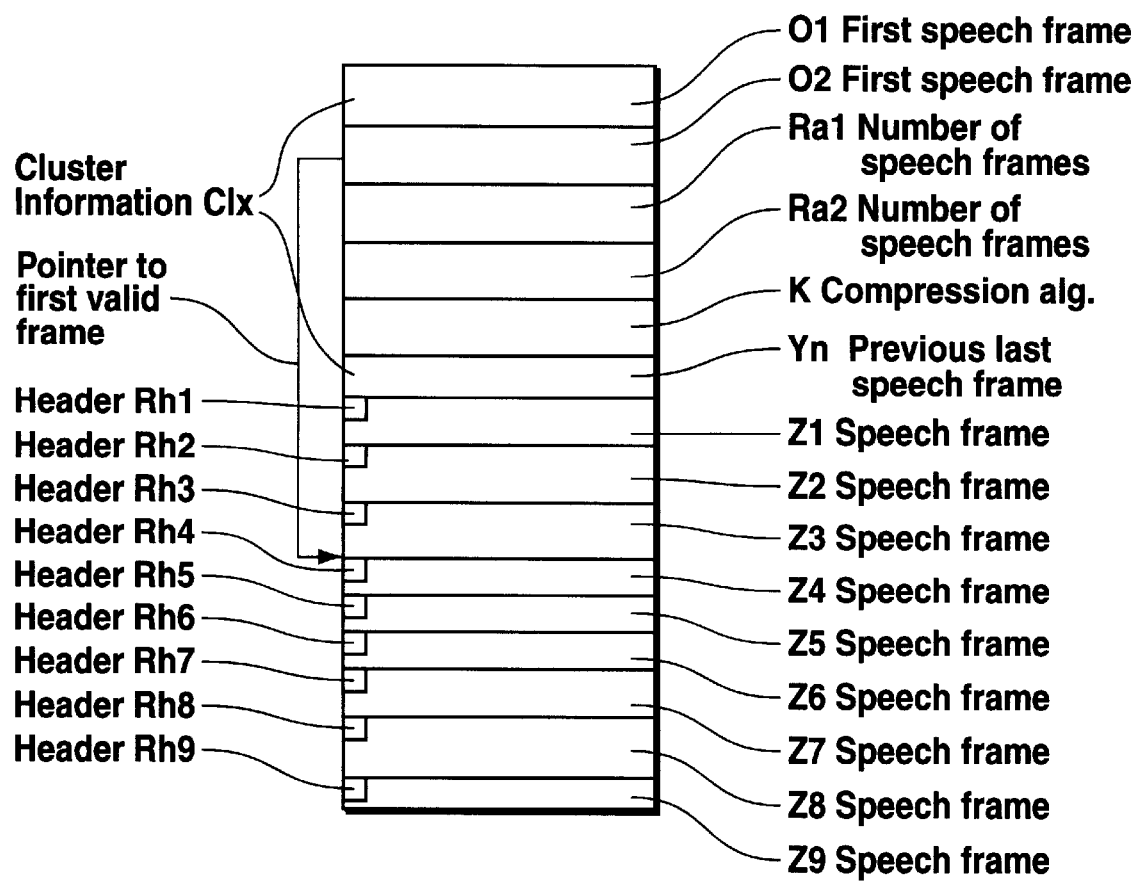
FIG. 3 shows an exemplary representation of a dictation cluster.

An exemplary representation of a dictation cluster is described below in connection with FIG. 3.

The figure shows a file cluster of the kind particularly occurring in flash memories. Invalid speech frames are marked in the cluster. The file cluster consists essentially of cluster information Clx which, for its part, consists of the entries O1, O2, Ra1, Ra2 and K. O1 and O2 designate the entries for the addresses of the first speech frame. Ra1 and Ra2 define the number of speech frames. Ra1 is correlated to O1, and Ra2 to O2. In the example, entry O1 is e.g. invalid and O2 valid and points to the first valid speech frame Z4. The speech frames Z1 through Z3 are thereby marked as being invalid. The speech frame Yn, stored in the previous cluster as the last speech frame, extends beyond the previous cluster and is completed in the current cluster. In this manner, a complete utilization of the memory is effected without gaps. Ra2 contains the number of valid speech frames in the cluster beginning with speech frame Z4, the address of which is deposited in O2. Ra2 contains the value 4 in accordance with which the speech frames Z4 through Z7 are valid. K indicates the compression algorithm. Rh1 through Rh9 designate the speech frame headers. The speech frame headers Rh1 through Rh3 as well as Rh7 through Rh9 note that these speech frames (Z1 through Z3 and Z7 through Z9) contain speech. Rh4 through Rh6 designate the speech frames Z4 through Z6 in which speech pause information is stored.

During read-out, information O1 is initially read out and recognized as being invalid. In the subsequent step, the information content of O2 is therefore read-out. Since this information is recognized as being valid, Ra2 is read-out defining the number of valid speech frames. K is subsequently read out and analyzed, wherein the compression algorithm is recognized. In the subsequent step, the address of the first valid speech frame (O2) is accessed. Z4 frame header Rh4 is evaluated to thereby indicate whether or not one is dealing with a frame having speech information or a frame containing speech pauses. Speech pauses have the advantage that the frames require less memory for equal time lengths. The valid speech frames are subsequently read-out, decoded, and played-back. After read-out of the last valid speech frame Z7 the next cluster is determined and processed as described above.

A suitable control unit in the form of a microprocessor is needed for carrying-out this method which, when playing-back a file which generally contains a dictation for the case of a dictation machine, reads the address of the first cluster from the contents register IV as well as the entry in the file allocation table FAT for the desired dictation. Following determination of the address in this manner, cluster information Cl1 of the first cluster is read out of the bulk storage medium and, using this information, the speech frames which should be read out of the bulk storage medium and acoustically output are determined. As soon as all relevant speech frames of this cluster, stored as data D1a, have been output, the address of the subsequent cluster contained in the file allocation table FAT is used to read-out the cluster information Cl1b of the next cluster and the next entry in the file allocation table FAT and the speech frames of this cluster which are designated as relevant are then read out from the data D1b and acoustically output. This process is repeated until no additional cluster address is contained in the file allocation table FAT, rather a data-end mark. In this manner, the control unit recognizes that no further cluster should be output and ends play-back.

When recording a dictation, speech data are stored on the bulk storage medium. The control unit thereby initially searches the contents register IV for clusters marked as being free which can be used for storage. After storage of the speech data in the form of speech frames which are output by an encoder, the control unit automatically produces the corresponding cluster information Clx which is stored at the beginning of the cluster. In general, a plurality of speech frames do not exactly fill-up a cluster so that portions of speech frames are also stored in a subsequent cluster. The control unit thereby determines the start addresses of the first speech frame beginning a cluster and a number of speech frames beginning the cluster and controls the storage of these entries at the beginning of the cluster in the memory locations provided therefor.

Before the next free cluster for further storage is determined, its start address is stored in an entry in the file allocation table FAT which is read-out with the previous cluster. At the end of the dictation, instead of the start address of the next cluster, a data-end mark is automatically stored by the control unit in the file allocation table FAT.

If an insert is to be made following a dictation, the user enters the location at which the insert should be made. The control unit recognizes the cluster and the speech frames subsequent to which the insert should be made, searches the next free cluster in the contents register IV and stores the addresses of the originally subsequent cluster and the remaining speech frames of the current cluster in a buffer. In addition, the control unit changes the cluster information Clx of this cluster in such a fashion that the speech frames following the location at which the insertion should take place are no longer relevant and replaces the reference in the file allocation table FAT to the originally next cluster by a reference to the next cluster determined to be free. Storage of the speech frames to be inserted then follows. When the user ends his insert, the control unit adds the buffered speech frames from the buffer and stores the reference out of the buffer to the originally subsequent cluster in the entry in the file allocation table FAT which is read out with the current cluster.

A change in the references stored in the file allocation table FAT effects, during insertion, the entry of the clusters to be entered in the logical sequence of the original occupied cluster to thereby change the sequence of play-back.

If the information stored in cluster information Clx concerning the number of relevant speech frames in the cluster, the start address of the first speech frame, and the start address of the next cluster should not be or are not to be overwritten, one can, in each case, provide for a plurality of memory locations in the cluster information Clx for such information with, in the event of a change, the new information being stored in the next free storage region. The control unit thereby always evaluates the information in the last written storage region. The control unit recognizes which one this is using the stored value.

What is claimed is:

1. A method for storing speech data in files for a digital dictation device comprising the steps of:
   a) subdividing a memory into clusters and into a file allocation table, each cluster being associated with a reference in said file allocation table to a next cluster of the file and a last cluster of the file being associated with a data-end mark;
   b) subdividing each cluster into speech frames;
   c) storing validity information for said speech frames, said validity information indicating a storage location of a first speech frame and a total number of speech frames in said cluster;
   d) storing encoded speech data in said speech frames; and
   e) marking said speech frames with speech frame headers.

2. The method of claim 1, further comprising storing said validity information at least twice.

3. The method of claim 1, wherein said speech frame headers comprise identification keys to indicate whether the frames contain speech information or speech pause information.

4. The method of claim 1, wherein said speech frame headers contain information for stepping a quality of a speech signal.

5. A method for storing speech data in a file for a digital dictation device comprising the steps of:
   a) subdividing a memory into clusters and into a file allocation table, each cluster being associated with a reference in said file allocation table to a next cluster of the file and a last cluster of the file being associated with a data-end mark;
   b) subdividing each cluster into speech frames;
   c) storing validity information for said speech frames, said validity information indicating a storage location of a first speech frame and a total number of speech frames in said cluster;
   d) storing encoded speech data in said speech frames; and
   e) changing said reference in said file allocation table to one of insert and remove at least one cluster of the file for effecting a desired changed sequence of clusters.

6. The method of claim 5, wherein, to insert at least one cluster into the file, a reference to a last cluster prior to insertion is changed to point to a first cluster to be inserted and a reference to a last cluster to be inserted is changed to point to a first cluster following insertion.

7. The method of claim 5, further comprising the step of changing a reference to a last cluster preceding a cluster to be removed to point to a first cluster following said cluster to be removed for erasing at least one cluster from the file.

8. The method of claim 7, wherein said validity information is changed to newly store at least one of a storage location of said first speech frame and said total number of speech frames at a storage location provided therefor to remove at least one speech frame at one of a beginning and end of said cluster from play-back.

9. A method for playing-back speech data in files for a digital dictation device having a control unit, the method comprising the steps of:
   a) subdividing a memory into clusters and into a file allocation table, each cluster being associated with a reference in said file allocation table to a next cluster of the file and a last cluster of the file being associated with a data-end mark;
   b) storing speech data validity information in each cluster;
   c) specifying a read out sequence for speech data in said file allocation table;
   d) evaluating, with the control unit, said speech data information stored in each cluster; and
   e) reading out, decoding and outputting, using the control unit, speech data indicated as valid by said speech data validity information.

10. The method of claim 9, wherein the control unit analyzes said validity information consisting essentially of a start address of a first speech frame and a number of stored speech frames until the control unit recognizes an impossible value given for at least one of said start address of said first speech frame and said number of stored speech frames and utilizing values extracted directly before said impossible value to always utilize a last stored validity information.

11. The method of claim 9, further comprising the steps of:
   e) subdividing each cluster into speech frames and validity information, said validity information indicating a storage location of a first speech frame and a total number of speech frames in said cluster;
   f) marking said speech frames with speech frame headers; and
   g) storing indicators in said frame headers to indicate whether said speech frames contain speech information or speech pause information.

12. The method of claim 11, wherein identifiers for stepping a quality of a speech signal are contained in said speech frame headers.

* * * * *